United States Patent [19]

Inadachi

[11] 4,117,545

[45] Sep. 26, 1978

[54] MEMORY INCLUDING DUMMY CELLS

[75] Inventor: Masaaki Inadachi, Kokubunji, Japan

[73] Assignee: Hitachi, Ltd., Japan

[21] Appl. No.: 778,108

[22] Filed: Mar. 16, 1977

[30] Foreign Application Priority Data

Mar. 26, 1976 [JP] Japan .................................. 51-32574

[51] Int. Cl.² ............................................ G11C 13/00
[52] U.S. Cl. .................................... 365/207; 365/210
[58] Field of Search .................... 340/173 R; 365/207, 365/210

[56] References Cited

U.S. PATENT DOCUMENTS

| | | | |
|---|---|---|---|
| 3,774,176 | 11/1973 | Stein et al. | 340/173 R |
| 3,983,544 | 9/1976 | Dennison | 340/173 R |

*Primary Examiner*—Terrell W. Fears
*Attorney, Agent, or Firm*—Craig & Antonelli

[57] ABSTRACT

A memory comprises a plurality of memory cell groups of different memory cell structure, dummy cell groups of different cell structure arranged one for each or several of said memory cell groups, a means for selecting a desired memory cell and a dummy cell corresponding to the group of that memory cell, and a means for differentially sensing outputs of said selected dummy cell and said selected memory cell.

8 Claims, 5 Drawing Figures

MEMORY INCLUDING DUMMY CELLS

BACKGROUND OF THE INVENTION

The present invention relates to a memory including dummy cells.

In a one-chip memory where a number of memory cells are arranged on a single substrate in a batch process, when a signal read out of the memory cell is small, a dummy cell is used to sense the small signal at a high signal-to-noise ratio.

Heretofore, in the memory of this type, dummy cells have been provided one for each of a pair of data lines connected to each preamplifier.

A major noise appearing on the data lines is caused by electrostatic capacitances dependent on overlapping areas of word lines and the data lines at the crosspoints thereof. When the memory cells of different structure are included, the electrostatic capacitances differ between the data lines because of the layout of the memory cells and the misalignment of a mask during a manufacturing process. Accordingly, where the dummy cells are arranged one for each of the data lines as in the prior art memory, a memory cell having a different electrostatic capacitance than that of the dummy cell always exists and the noises on the pair data lines differ from each other resulting in the reduction of the signal-to-noise ratio.

SUMMARY OF THE INVENTION

It is an object of the present invention to provide a memory with an improved signal-to-noise ratio for readout signals from memory cells where memory cells of different structure are connected to each of a pair of data lines.

In order to achieve the above object, the present invention is characterized in that a plurality of dummy cells are arranged one for each of a plurality of memory cell groups of different structure, for each of the pair of data lines.

DESCRIPTION OF THE PRIOR ART

Figure 1:
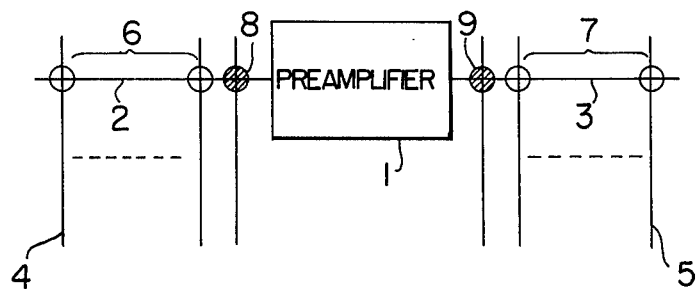
FIG. 1 shows a schematic diagram of a prior art memory.

FIG. 1 shows a schematic diagram of a prior art memory, in which a pair of data lines 2 and 3 are arranged on both sides of a preamplifier which may be a differential amplifier with the data lines 2 and 3 intersecting word line groups 4 and 5, respectively, and memory cell groups 6 and 7 and dummy cells 8 and 9 being arranged at the intersections. The dummy cells 8 and 9 are arranged one for each of the pair of data lines 2 and 3 which constitute two inputs for the preamplifier 1 such that when one of the memory cells in the memory cell group 6 or 7 is selected, the dummy cell 9 or 8 is selected.

The dummy cells 8 and 9 each provides a reference voltage to one of the inputs of the preamplifier 1 which discriminates "1" or "0" stored information in the memory cell. The dummy cells further play an important role of equalizing coupling voltages applied to the pair of data lines 2 and 3 connected to the two inputs of the preamplifier 1, which coupling voltages are produced by readout pulse voltages on the word lines 4 and 5 acting as drive lines and coupled through electrostatic capacitances, so that a differential noise is eliminated to allow signal sensing at a high sensitivity.

Figure 2:
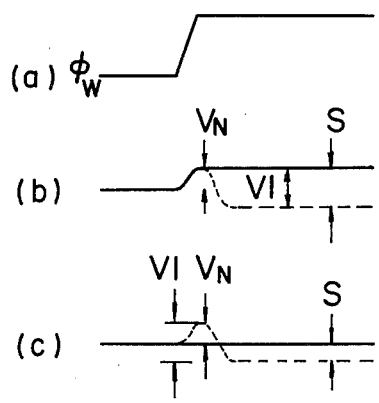
FIG. 2 shows waveforms for explaining the operation of the prior art memory.

More particularly, as shown in FIG. 2(b), noise voltages $V_N$ applied to the data lines 2 and 3 through the coupling capacitances at the rise of read pulse $\Phi W$ (FIG. 2(a)) to the word lines 4 and 5 are equalized between the two data lines 2 and 3 so that a net difference (approximately $V_1$) between the readout voltage from the dummy cell 8 or 9 (shonw by a solid line, approximately 0 volt) and the readout voltage from the memory cell 7 or 6 (shown by a dotted line, $V_1$ volts) is taken out as a signal voltage S.

On the other hand, the noise voltage $V_N$ is caused by the electrostatic capacitance dependent on an overlapping area of the word line 4 or 5 and the data line 2 or 3 at the intersection thereof. Where the memory cells of different structure are included, the noise voltages $V_N$ applied to the pair of data lines differ from each other because the electrostatic capacitances differ based upon the fact that the overlapping of the word lines and the data lines differ depending on the layouts and the misalignment of masks in the manufacturing process. Thus, because of the difference in the structure or the error included in the manufacturing process, the prior art memory in which one dummy cell is arranged on the data line on one side of the preamplifier necessarily includes a memory cell having a different overlapping area of the data line and the work lines than that of the dummy cell. In such a memory, as shown in FIG. 2(c), the noises $V_N$ on the pair of data lines differ from each other and the signal voltage S is reduced to $V_1 - V_N$ resulting in the reduction of the signal-to-noise ratio. In FIG. 2(c), it is assumed that a noise voltage on the data line having the selected dummy cell is zero.

DETAILED DESCRIPTION OF THE PREFERRED EMBODIMENTS

Figure 3:
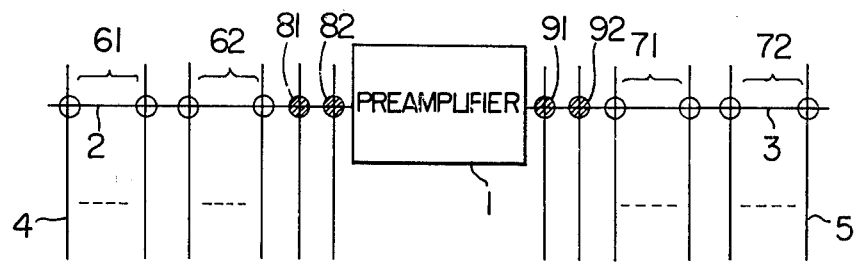
FIG. 3 shows a construction of one embodiment of a major section of a memory of the present invention.

FIG. 3 shows an embodiment of a major section of a memory in accordance with the present invention. The essence of the present invention lies in that in a memory having memory cell groups of different memory cell structures, for example, in a memory having different overlapping areas of the word lines and the data lines because of arrangement of the memory cells of the same form or configuration in different directions on the data lines, dummy cells are arranged one for each of memory cell groups of different memory cell structures from each other, that is, as many dummy cells as the number of memory cell groups of different memory cell structures are arranged. FIG. 3 shows an example where two memory cell groups of different structure are used in which memory cell groups 61 and 71 or memory cell groups 62 and 72 have the same structure while the memory cell groups 61 and 62 and the memory cell groups 71 and 72 have different structures. The memory cell groups 71 and 72 to the right of a preamplifier 1 are associated with dummy cells 81 and 82, respectively, while the memory cell groups 61 and 62 to the left of the preamplifier 1 are associated with dummy cells 91 and 92, respectively.

Figure 4:
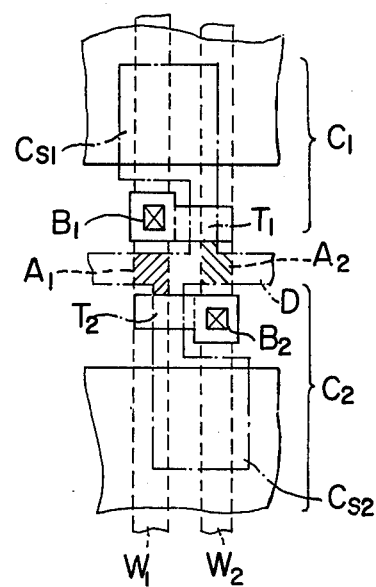
FIGS. 4 and 5 are plan views illustrating layouts of memory cells and dummy cells, respectively.
Figure 5:
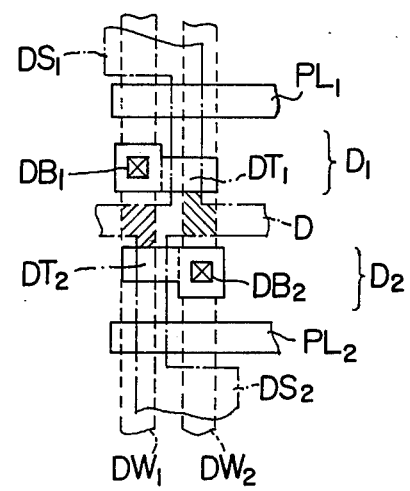

FIG. 4 shows an example of a layout of the memory cells of different structure and FIG. 5 shows an example of layout of the corresponding dummy cells. Each cell comprises a one-transistor cell in the illustrated examples.

In FIG. 4, $C_1$ and $C_2$ denote memory cells, D denotes a data line formed by poly-silicon, $W_1$ and $W_2$ denote word lines of aluminum, $T_1$ and $T_2$ denote switching MOS transistors formed, $B_1$ and $B_2$ denote contact areas of the gate electrodes of the transistors $T_1$ and $T_2$ with the word lines $W_1$ and $W_2$, and $C_{S1}$ and $C_{S2}$ denote storage capacitances.

In FIG. 5, $D_1$ and $D_2$ denote dummy cells, $DW_1$ and $DW_2$ denote dummy word lines, $DT_1$ and $DT_2$ denote switching MOS transistor formed, $DB_1$ and $DB_2$ denote contact areas of the gate electrodes of the transistors $DT_1$ and $DT_2$ with the word lines $DW_1$ and $DW_2$, $PL_1$ and $PL_2$ denote precharge lines, and $DS_1$ and $DS_2$ denote storage capacitances.

The memory cells $C_1$ and $C_2$ in FIG. 4 correspond to the dummy cells $D_1$ and $D_2$ in FIG. 5, respectively.

In the memory cells $C_1$ and $C_2$ of FIG. 4, the switching MOS transistors $T_1$ and $T_2$ and the word lines $W_1$ and $W_2$ may appear, at a glance, to have the same structure relative to the data line D. However, when an aluminum mask used in a manufacturing process to form the word lines $W_1$ and $W_2$ is misaligned to the left or right relative to a poly-silicon mask used to form the data line D, an overlapping area (hatched area $A_2$) of the word line $W_2$ and the data line D becomes different from an overlapping area (hatched area $A_1$) of the word line $W_1$ and the data line D. For such memory cells, the dummy cells $D_1$ and $D_2$ shown in FIG. 5 are arranged for the memory cells $C_1$ and $C_2$, respectively. In this case, the memory cells and the dummy cells have the same overlapping to the data line so that the noises dependent on the word lines can be completely cancelled.

While the illustrated example uses as many dummy cells as the number of memory cell groups of different structure, it should be understood that a common dummy cell may be used for those of the memory cell groups which have like characteristics.

In FIG. 3, a detection circuit including a sense amplifier is connected to one or both of the data lines and a drive circuit is connected to the word lines.

As described hereinabove, according to the dummy cell arrangement of the present invention, even if there has been a misalignment of mask in the manufacturing process, the coupling voltages from the word lines to the data lines are completely equalized on the both sides of the preamplifier so that the readout signal can be sensed at a high signal-to-noise ratio. While the illustrated example of FIG. 3 shows the memory cell groups 61 and 62 and the memory cell groups 71 and 72 each concentrated at the same area, in an arrangement where the layout shown in FIG. 4 repetitively appears, odd-numbered memory cells and even-numbered memory cells may constitute the respective groups.

While FIGS. 4 and 5 show the examples of one-transistor cell, it should be understood that the present invention may be applied to various types of cell.

Furthermore, the present invention may be applied not only to the semiconductor memory as described above but to other memory such as a wire memory, in which case, the signals on the data lines may be directly sensed by a sense amplifier.

Moreover, while the data lines are arranged on both sides of the preamplifier in the illustrated embodiment, they may be arranged in parallel on one side of the preamplifier. Further, plural pairs of data lines may be selectively connected to the preamplifier.

I claim:

1. A memory comprising:
    at least one pair of sense lines;
    sensing means for differentially sensing signals on said pair of sense lines;
    a plurality of drive lines arranged to intersect said sense lines;
    a plurality of memory cell groups of different structure from each other coupled to respective intersections of one of said pair of sense lines and said drive lines; and
    a plurality of dummy cells of different structure from each other coupled to intersections of the other of said sense lines and said drive lines in correspondence with said memory cell groups, each dummy cell having substantially the same cell structure as that of the corresponding memory cell group.

2. A memory according to claim 1, wherein at least two memory cell groups of different structure are arranged on each data line.

3. A memory according to claim 1, wherein said memory cell groups each comprise a plurality of memory cells having such an arrangement that intersecting areas of said drive lines and said sense lines is varied by coplanar displacement of one of said drive lines and said sense line, said dummy cells having substantially the same relationship in arrangement between said drive and sense lines as that of said memory cell groups.

4. A memory comprising:
    at least a pair of first and second sense lines;
    sense means for differentially sensing signals on said first and second sense lines;
    first and second memory cell groups of different structure from each other coupled to each of said first and second sense lines;
    first and second dummy cells coupled to said second sense line and having substantially the same memory cell structure as that of said first and second memory cell groups, respectively, coupled to said first sense line; and
    third and fourth dummy cells coupled to said first sense line and having substantially the same memory cell structure as that of said first and second memory cell groups, respectively, coupled to said second sense line.

5. A memory according to claim 1, wherein each of said memory cell groups comprises a plurality of memory cell sub-groups.

6. A memory according to claim 1, wherein said memory cells and said dummy cells each comprises a switching element the switching of which is controlled by the signal on said drive line, and a capacitive element connected to said switching element.

7. A memory according to claim 1, wherein said sense means comprises a differential amplifier for differentially amplifying the signals on said pair of sense lines.

8. A memory according to claim 4, wherein said sense means comprises a differential amplifier for differentially amplifying the signals on said first and second sense lines.

* * * * *